United States Patent
Rick

(10) Patent No.: US 7,088,792 B2
(45) Date of Patent: *Aug. 8, 2006

(54) DEVICE AND METHOD FOR EFFICIENT DECODING WITH TIME REVERSED DATA

(75) Inventor: Roland Rick, San Diego, CA (US)

(73) Assignee: LSI Logic Corporation, Milpitas, CA (US)

( * ) Notice: Subject to any disclaimer, the term of this patent is extended or adjusted under 35 U.S.C. 154(b) by 607 days.

This patent is subject to a terminal disclaimer.

(21) Appl. No.: 09/863,736

(22) Filed: May 22, 2001

(65) Prior Publication Data

US 2002/0057748 A1 May 16, 2002

Related U.S. Application Data

(63) Continuation of application No. 09/049,412, filed on Mar. 27, 1998, now Pat. No. 6,272,187.

(51) Int. Cl.
*H03D 1/00* (2006.01)
*H04L 27/06* (2006.01)

(52) U.S. Cl. .................. 375/341; 375/262; 714/786; 714/795

(58) Field of Classification Search .............. 375/341, 375/130, 135, 136, 140, 141, 146, 147, 262; 714/786, 794, 795, 758, 746
See application file for complete search history.

(56) References Cited

U.S. PATENT DOCUMENTS 5,103,451 A 4/1992 Fossey .................. 371/37.6
5,511,068 A 4/1996 Sato ....................... 370/18
5,920,593 A 7/1999 Perl et al. ................ 375/222
6,041,433 A 3/2000 Kamada ................... 714/795

FOREIGN PATENT DOCUMENTS

EP 0551646 A2 * 12/1992

OTHER PUBLICATIONS

Lin et al., Error Correction Coding: Fundamental and Applications, Chapter 4, 1983.
Paul H. Young, Electronic Communication Techniques, 2nd Ed., pp. 550–557, 1993.

* cited by examiner

*Primary Examiner*—Jean B. Corrielus
(74) *Attorney, Agent, or Firm*—Mitchell Silberberg & Knupp LLP

(57) ABSTRACT

A novel device which efficiently decodes data encoded with a cyclic code in communications systems where a convolutional code is applied after the cyclic code during encoding. Specifically, the device accepts data provided in time reversed order by a Viterbi decoder which decodes the convolutional code. In a preferred version, the device employs linear feedback shift registers with multiple feedback paths. A set of multipliers corresponding to a set of coefficients is interposed in the feedback paths such that when data is shifted through the feedback shift registers, the device performs division by x for an input bit equal to 0, and, for an input bit equal to 1, performs division by x and then adds $x^{k+m-1}$. The set of multipliers includes a set of weighting multipliers corresponding to coefficients of a weighting polynomial such that addition of $x^{k+m-1}$ is performed for an input bit equal to 1. In another preferred version, the device compares a known initial state to a final state generated by shifting time reversed data through the linear feedback shift registers such that the final state equals the known initial state if there are no errors.

10 Claims, 2 Drawing Sheets

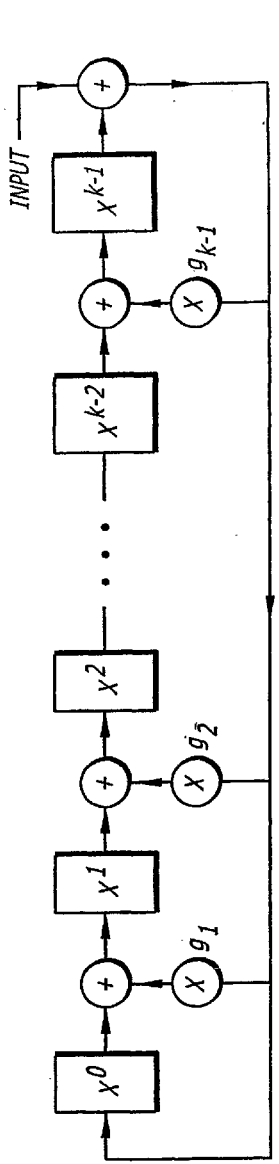
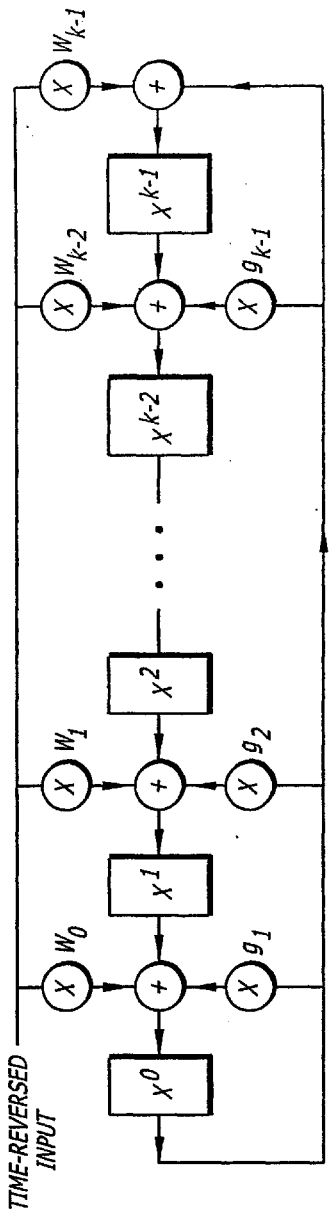
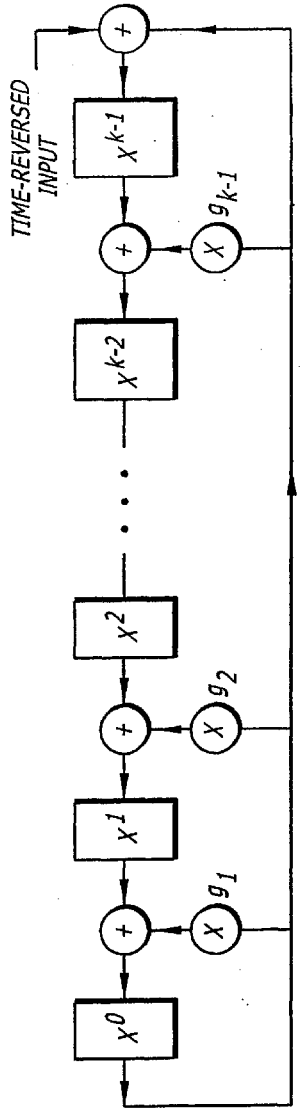
FIG. 1 (PRIOR ART)
FIG. 2
FIG. 3

DEVICE AND METHOD FOR EFFICIENT DECODING WITH TIME REVERSED DATA

This is a continuation of U.S. patent application Ser. No. 09/049,412, which was filed on Mar. 27, 1998, and issued as U.S. Pat. No. 6,272,187 on Aug. 7, 2001.

BACKGROUND OF THE INVENTION

1. Field of the Invention

This invention relates to the field of electronic communications. In particular, the present invention concerns optimally decoding data encoded with a cyclic code in communications systems where a convolutional code is applied after the cyclic code during the encoding process.

2. Description of the Related Art

In the field of electronic communications, channel coding is used to ensure the accuracy of data transmitted from one point to another. Channel coding refers to a class of signal transformations designed to improve communications performance by enabling the transmitted signals to better withstand the effects of various communications channel impairments, such as noise, fading, and jamming.

One set of channel coding techniques is referred to as linear block codes, which transform a block of k message bits into a longer block of n codeword bits. Binary cyclic codes are an important subclass of linear block codes. The codes are easily implemented with feedback shift registers in integrated circuits, and the underlying algebraic structure of cyclic codes lends itself to efficient decoding methods. Cyclic Redundancy Checks (CRC) are cyclic codes which are commonly used in communications systems, including cellular applications.

Another set of channel coding techniques is referred to as convolutional codes, which are described by three integers, n, k, and K. The integer K is a parameter known as the constraint length; it represents the number of k-tuple stages in the encoding shift register. An important characteristic of convolutional codes, which is not shared by linear block codes, is that the encoder has memory: The n-tuple emitted by the convolutional encoding procedure is not only a function of an input k-tuple, but also of the previous K–1 input k-tuples. Data which has been convolutionally encoded is often decoded using Viterbi decoders, which generally output decoded data in time reversed order.

Convolutional and linear block coding techniques are often combined, for example in wireless cellular communications systems, resulting in significantly improved overall performance. Typical communications systems encode data first with a cyclic code for error detection, and then with a convolution code for error correction. A conventional receiver for such a system first uses a Viterbi decoder to decode the convolutional code and correct as many errors as possible. Then, a different decoder is used to decode the cyclic code and determine whether all of the errors were corrected or not.

In Code-Division Multiple Access (CDMA), Time-Division Multiple Access and most other cellular communications systems, data is divided into a number of "frames" including frame quality indicator bits (sometimes called "CRC bits") generated using a CRC code. The conventional method of calculating CRC bits is using a circuit provided in TIA Standards Proposal #3384, "Personal Station Base Station Compatibility Requirements for 1.8 to 2.0 GHz Code Division Multiple Access Personal Communications Systems," and several related TIA Standards. The conventional method requires that the input bits be in normal time order (first bit in first), which is disadvantageous for the following reasons.

In most applications, the CRC bits in a receiver are calculated after a Viterbi decoder. Optimal Viterbi decoding requires a full "traceback" to calculate the input bits, which results in the input bits to the CRC generator being available in time reversed order. If the conventional method of calculating the CRC bits is used, the input bits need to be buffered up and fed into the CRC generator after all of the input bits are generated. It would be preferable to calculate CRC bits from a frame of data that is available in time reversed order (i.e., last bit available first) since this would allow the quality of a frame to be checked simultaneously with the Viterbi decoding, without buffering any bits. This reduces the hardware and other device complexity in implementation.

Therefore, an object of this invention is to provide a circuit which can decode in time reversed order, without buffering any bits, data encoded with a cyclic code in systems where a convolution code is applied after the cyclic code during the encoding process.

SUMMARY OF THE INVENTION

This object is achieved by the present invention, which comprises a device which efficiently decodes data encoded with a cyclic code in communications systems where a convolutional code is applied after the cyclic code during encoding, wherein the device accepts data provided in time reversed order by a Viterbi decoder which decodes the convolutional code. In a preferred version, the device employs linear feedback shift registers having a plurality of feedback paths. A set of multipliers corresponding to a set of coefficients is interposed in the feedback paths such that when data is shifted through the feedback shift registers, the device performs division by x for an input bit equal to 0, and, for an input bit equal to 1, performs division by x and then adds $x^{k+m-1}$. The set of multipliers includes a set of weighting multipliers corresponding to coefficients of a weighting polynomial such that addition of $x^{k+m-1}$ is performed for an input bit equal to 1. In another preferred version, the device compares a known initial state to a final state generated by shifting time reversed data through the linear feedback shift registers such that the final state equals the known initial state if there are no errors.

As a result of this novel configuration, the quality of a data frame can be checked simultaneously with Viterbi decoding, without buffering any bits. This reduces the hardware and other device complexity in implementation. These and other aspects, features, and advantages of the present invention will be apparent to those persons having ordinary skill in the art to which the present invention relates from the foregoing description and the accompanying drawings.

BRIEF DESCRIPTION OF THE DRAWINGS

FIG. 1 is a block diagram of a conventional CRC circuit.

FIG. 2 is a block diagram of a preferred version of the CRC circuit of the present invention.

FIG. 3 is a block diagram of another preferred version of the CRC circuit of the present invention.

DESCRIPTION OF THE PREFERRED EMBODIMENTS

Figure 4:
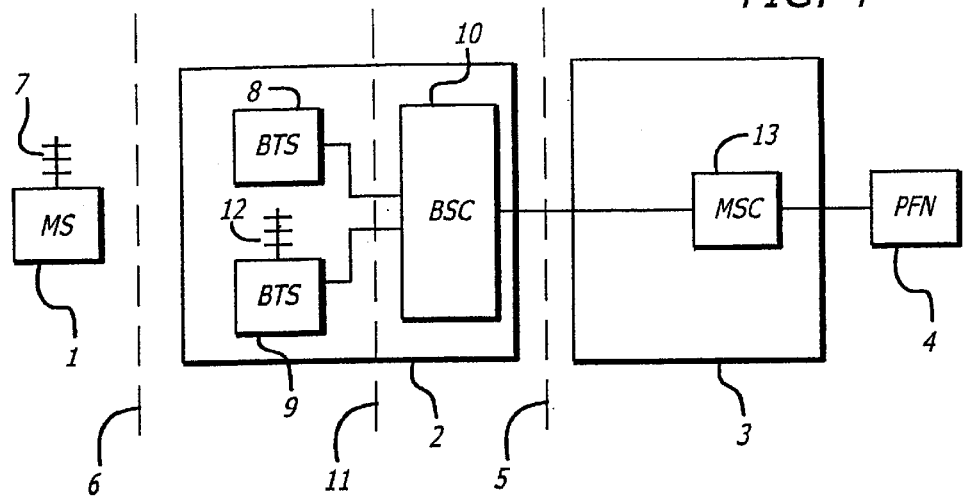
FIG. 4 is a block diagram of a wireless communications system.

A. CRC Characteristics and the Conventional Decoding Method

The conventional method for calculating the CRC is described in the J-STD-008 standard, pages 3–34–36. FIG. 1 shows a conventional circuit for calculating a k-bit CRC. The behavior of this circuit can be analyzed using Galois field theory. The coefficients, $g_i$, can be represented as a polynomial with the following form:

$$g(x)=g_k x^k + g_{k-1} x^{k-1} + \ldots + g_1 x + g_0 \qquad (1)$$

where the coefficients are taken from GF(2), which is simply the set $\{0,1\}$. The state of the shift registers above are defined by a polynomial $h(x)$ with the following form, $$h(x)=h_{k-1} x^{k-1} + h_{k-2} x^{k-2} \ldots + h_0 \qquad (2)$$

where the coefficients are also taken from GF(2). The input bits are represented by a polynomial, $$a(x)=a_0 + a_1 x + a_2 x^2 + \ldots + a_{m-1} x^{m-1} \qquad (3)$$

where $a_i$ represents the input bits, $a_0$ is the first input bit, and m is the total number of input bits for a frame. The conventional circuit shown in FIG. 1 multiplies the state polynomial $h(x)$ by x, and takes the remainder with respect to the generator polynomial $g(x)$. (Note: The "remainder" of a polynomial with respect to $g(x)$ is the remainder after dividing the polynomial by $g(x)$.) This circuit is similar to circuits commonly used to generate pseudorandom number (PN) sequences. What makes this circuit different from a PN sequence generator is the presence of the input data stream.

For each input bit, if the input bit is a 0, the state polynomial is multiplied by x and the remainder is taken with respect to the generator polynomial $g(x)$. If taking the remainder with respect to $g(x)$ is denoted by $<\ >_{g(x)}$, this operation can be expressed as:

$$h(x)=<h(x)*x>_{g(x)} \qquad (4)$$

If the input bit is a 1, the state polynomial is multiplied by x, then $x^k$ is added to the polynomial, and then the remainder with respect to $g(x)$ is taken. This can be expressed as:

$$h(x)=<h(x)*x+x^k>_{g(x)} \qquad (5)$$

Since the result is the same whether or not the remainder with respect to $g(x)$ is taken at each step or after all of the input bits, the CRC can be represented by the polynomial $c(x)$ given by:

$$c(x)=<h'(x)x^m + x^k[a_0 x^{m-1} + a_1 x^{m-2} + \ldots + a_{m-1}]>_{g(a)} \qquad (6)$$

where $h'(x)$ is the initial state of the registers. For J-STD-008, the initial state of the registers is all ones, which can be represented by:

$$h'(x)=x^{k-1}+x^{k-2}+ \ldots +x+1 \qquad (7)$$

The problem with the conventional method is that the circuit requires the first input to be the first data bit of the packet. In implementing a standard Viterbi decoder, the output bits are calculated during traceback, which starts at the end of the data packet and moves toward the beginning. The simplest solution is to buffer the input bits and feed them through the CRC generator after the Viterbi decoder traceback is complete. This, however, requires extra complexity in the data flow. A more desirable solution is to derive a circuit that will compute the same CRC, but accept the input bits in time reversed order.

B. Time Reversed Data Implementation

In receivers for many practical communications systems, including J-STD-008, the CRC is calculated after the Viterbi decoder. A Viterbi decoder generally outputs data in time reversed order if a full traceback is done. It is generally desirable to just push CRC input data into the CRC generator circuit as it becomes available instead of buffering up all of the data and taking the extra step to generate the CRC after the Viterbi decoder is finished. What is needed is a circuit that produces the same CRC, given by $c(x)$ above, but accepts the input data in time reversed order.

An approach that will generate the same CRC if the first input bit is $a_{m-1}$ is now described. In a preferred version of the present invention, the initial state of the registers is:

$$h(x)=<h'(x)x^{2m}>_{g(x)} \qquad (8)$$

where $h'(x)$ is the initial state for the standard method. For each input bit, if the input bit is a 0, the state polynomial is divided by x, and then the remainder is taken with respect to $g(x)$, which can be expressed as:

$$h(x)=<h(x)*x^{-1}>_{g(x)} \qquad (9)$$

If the input bit is a 1, the state polynomial is divided by x, $x^{k+m-1}$ is added to the result, and then the remainder is taken with respect to $g(x)$. This can be expressed as:

$$h(x)=<h(x)*x^{-1}+x^{k+m-1}>_{g(x)} \qquad (10)$$

This yields the same expression for the CRC as the conventional method. The only disadvantage to this method is that the initial state and the polynomial that is added when the input is a 1 are dependent on m, which is the length of the input packet. For CDMA systems, this is a minor disadvantage as there are only six different values of m for all of the rates in both rate sets, and these polynomials can be computed ahead of time.

A circuit which implements the time reversed CRC generation is shown in FIG. 2. The coefficients, $g_i$, represent the generator polynomial and are identical to those of the conventional method described above. The weighting polynomial, $w(x)$, is the polynomial that is added to accomplish the addition by $x^{k+m-1}$, and is given by:

$$w(x)=w_{k-1} x^{k-1} + w_{k-2} x^{k-2} \ldots + w_0 = <x^{k+m-1}>_{g(x)} \qquad (11)$$

For J-STD-008, the initial state of the registers is given by:

$$h(x)=<x^{2m}[x^{k-1}+x^{k-2}+ \ldots +x+1]>_{g(x)} \qquad (12)$$

The division by x is performed by reversing the direction of the shift registers and adding the generator polynomial when $x^0$ is a 1. The input bits are inserted into multiple stages of the shift register sequence, as opposed to just the end for the conventional method.

Another detail needed for implementation is the value of $h(x)$ and $w(x)$ for the six different CRC/packet size combi nations. A table for w(x) and h(x) for the CDMA standard is given below:

TABLE 1

Polynomials for Time Reversed CRC Generator

|  | h(x) | w(x) |
| --- | --- | --- |
| 12 bit - Rate Set 1 | 0x3B7 | 0x441 |
| 12 bit - Rate Set 2 | 0xF96 | 0x43C |
| 10 bit | 0x3D2 | 0x184 |
| 8 bit - Rate Set 1 | 0xC5 | 0x68 |
| 8 bit - Rate Set 2 | 0x6F | 0x83 |
| 6 bit | 0x2E | 0x2F |

All of the coefficients are represented as a single hex number where the LSB corresponds to $W_0/h_0$.

C. Alternative Time Reversed Implementation

The goal of generating a CRC is to check if the input frame was decoded correctly. It is desirable to do this with time reversed input data because that is how data is available in certain communications systems such as CDMA systems. An alternative approach is to start with the ending state of the shift register in the conventional method and work backwards to the starting state. If there are no errors in the input sequence, then the final state of the alternative method will equal the initial state of the conventional method.

FIG. 3 shows a circuit which will perform this function. The decision of whether the frame is correct involves comparing the initial state of the standard method to the state of the shift registers after the time reversed data is clocked into the circuit of FIG. 3. The difference between this method and the previously described methods is that it generates a fixed initial state from the received CRC, instead of generating a CRC from the received data and comparing it to the received CRC.

One advantage of this circuit is that the received CRC is at the end of the received data and can be loaded into the shift registers simply by considering it to be part of the received data that is clocked into the registers. If the CRC is to be loaded in this way, the initial state of the registers must be all zeros. A further advantage of this circuit is that, if the initial state of the registers is all zeros, then any extra zeros at the beginning of the time reversed input data will have no effect on the final state. Therefore, the tail (which by definition is all zeros regardless of the received data), the CRC, and the received packet, which together are the total output of the Viterbi decoder, can be input to the circuit shown in FIG. 3. If there are no errors in the received packet, the final state of the registers will be the initial state in the standard method. For J-STD-008, the initial state for all of the CRC generators is all ones.

D. Application in Wireless Systems.

By way of example but not of limitation, one possible application of the present invention is in wireless cellular communications systems. As shown in FIG. 4, a cellular network is comprised of three fundamental parts:

(1) a mobile station 1 (which is carried by the subscriber);

(2) a base station subsystem 2 (which controls the radio link with the mobile station); and (3) a network subsystem 3 (which is interfaced to the public fixed network 4 and the base station subsystem). The network subsystem and the base station subsystem communicate across an interface 5, while the mobile station and the base station subsystem communicate using a radio link 6.

Mobile Station

The mobile station is the "phone" part of the wireless communication system. The mobile station may be fixed or portable. Fixed mobile stations are permanently installed in a car or a stationary location. Portable units include bag phones and hand-portable phones (commonly called "cell phones"). Hand-portable phones are becoming increasingly popular because they can be carried easily on the person of the subscriber. A mobile station includes an antenna 7 for transmitting and receiving radio signals from the base station subsystem.

Base Station Subsystem

The base station subsystem comprises two fundamental elements, (1) one or more base transceiver stations (8 and 9) and (2) a base station controller 10. These components communicate across another interface 11. A base transceiver station includes radio transceivers that handle radio-link protocols with the mobile station and an antenna 12 for communication with mobile stations.

The base station controller manages the radio resources of the base transceiver stations. It also manages handovers (passing the audio from cell to cell during a call), frequency hopping (changing operating frequency to maintain signal quality) and radio-channel setup.

Network Subsystem

The basic element of the network subsystem is the mobile services switching center (MSC) 13. The MSC is the interface of the cellular network to the public fixed network and, as such, basically performs the functions of a switching node of the public fixed network The MSC also routes calls from the public fixed network (via the base station controller and the base transceiver station) to the mobile station. The MSC also provides the wireless system with individual information about the various mobile stations and performs the functions of authentication, location updating, and registration. The MSC may operate in conjunction with other functional entities which further comprise a network subsystem, such as registers which hold information regarding current mobile station location and subscriber information.

Radio Link

In conventional wireless communications technology, user data (e.g. speech) is encoded in a radio frequency for transmission and reception between a base station and a mobile unit. Because the number of available radio frequencies, or "channels," for cellular system is less than the number of all possible users, the system is "trunked." Trunking is the process whereby users share a limited number of channels in some predetermined manner.

A common form of trunked access is the frequency-division multiple access (FDMA) system. In FDMA, the limited channels are shared by all users as needed. However, once a channel is assigned to a user, the channel is used exclusively by the user until the user no longer needs the channel. This limits the number of concurrent users of each channel to one, and the total number of users of the entire system, at any instant, to the number of available channels.

Another common trunking system is the time-division multiple access (TDMA) system. TDMA is commonly used in telephone networks, especially in cellular telephone systems, in combination with an FDMA structure. In TDMA, data (speech) is digitized and compressed to eliminate redundancy and silent periods, thus decreasing the amount of data which is required to be transmitted and received for the same amount of information. Each of the channels used by the TDMA system is divided into "frames" and each of the users sharing the common channel is assigned a time slot within the frames. The TDMA system appears, to each of the users sharing the channel, to have provided an entire channel to each user.

Code-division multiple access (CDMA), yet another common trunking system, is an application of spread spectrum techniques. The main advantage of CDMA systems as compared to TDMA systems is that all the mobile stations can share the full transmission spectrum asynchronously, that is, there is no need for synchronization among mobile stations (only between a mobile station and a base station).

Mobile Station Architecture

Figure 5:
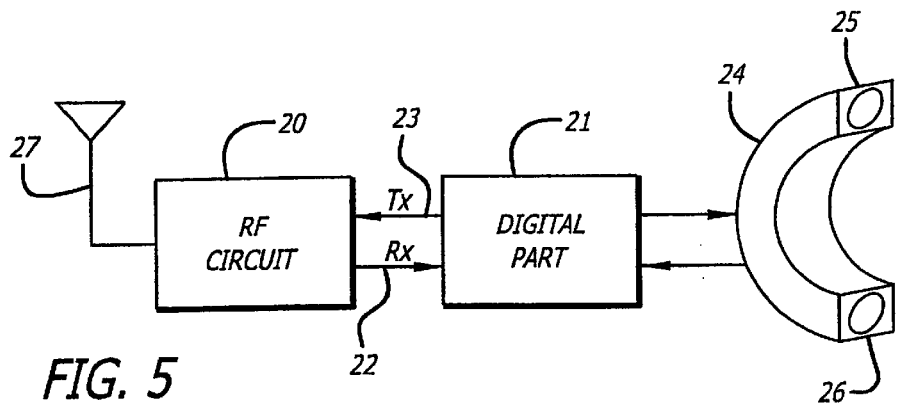
FIG. 5 is a block diagram of the basic architecture of a mobile station.

As shown in FIG. 5, mobile stations generally comprise two basic parts, the RF (radio frequency) part 20 and the digital part (or baseband processing circuitry) 21. The RF part operates receiving, transmitting, and modulation functions. The digital part handles data processing, control, and signaling functions. As shown, the radio frequency part includes an antenna 27 for receiving and transmitting radio signals. A radio signal received by the radio frequency part is converted to a lower frequency signal and delivered 22 to the digital part. Likewise, a signal generated by the digital part is delivered 23 to the radio frequency part, which in turn converts the signal to a higher frequency signal, and transmits that higher frequency signal.

The digital part is operatively connected to a handset 24, which has a speaker 25 and a mouthpiece 26. All or part of the radio frequency part and the digital part can be disposed within the handset, as is the case with cell phones.

Also included in the mobile station architecture (but not shown in FIG. 5) is a reference clock, which is used to drive the digital hardware. Clock circuitry may also include tuning circuitry or temperature compensation circuitry to make the reference signal more accurate. A control processor performs the control functions of the mobile station, including, for example, power control and the selection of different channels.

Figure 6:
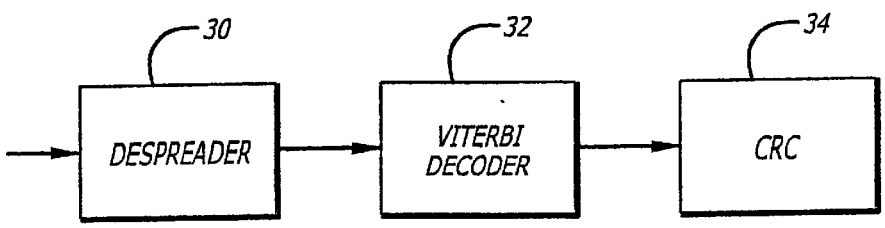
FIG. 6 is a more detailed block diagram of the basic architecture of a mobile system.

For CDMA systems, mobile stations generally include the following elements. Transmitting circuitry transmits as spread spectrum signals data (e.g. speech) provided by a user, while receiving circuitry receives spread spectrum signals and converts the signals into a form intelligible to the user. Pseudorandom noise (PN) sequence generator circuitry operationally connected to the transmitting circuitry and the receiving circuitry enables the mobile station to transmit and receive spread spectrum signals. Prior to transmission, each data bit is spread into a number of "chips" which can be transmitted in a bandwidth-limited channel along with signals of many other users, who can all share the channel. A chip rate clock, operating at a chip rate, clocks the PN sequence generator circuitry. FIG. 6 shows a more detailed block diagram of a CDMA based mobile system. As shown, a despreader 30 is coupled to a Viterbi decoder 32, which is coupled to a CRC circuit 34. The despreader 30 receives data and despreads it. The Viterbi decoder 32 receives the despread data and performs Viterbi decoding. The decoded data is then checked by th CRC circuit 34.

Although the present invention has been described in detail with regard to the exemplary embodiments and drawings thereof, it should be apparent to those skilled in the art that various adaptations and modifications of the present invention may be accomplished without departing from the spirit and the scope of the invention. Accordingly, the invention is not limited to the precise embodiment shown in the drawings and described in detail hereinabove. Therefore, it is intended that all such variations not departing from the spirit of the invention be considered as within the scope thereof as limited solely by the claims appended hereto.

In the following claims, those elements which do not include the words "means for" are intended not to be interpreted under 35 U.S.C. § 112 ¶6.

What is claimed is:

1. A device for decoding and error-checking data that have been encoded with a convolutional code, said device comprising:
   (a) a receiver which is configured to receive: (i) data having been used to generate a cyclic redundancy code (CRC) and then encoded with a convolutional code, and (ii) the CRC for the data;
   (b) a decoder which is configured to decode the data in order to remove the convolutional code and output the data in time-reversed order;
   (c) a cyclic redundancy check circuit which includes a plurality of serially connected linear feedback shift registers, collectively having a state; and
   (d) a plurality of feedback paths, each leading to an input of one of the linear feedback shift registers,
   wherein the cyclic redundancy check circuit is configured: (i) to initialize the state of the linear feedback shift registers to the CRC; (ii) upon completion of said initialization, to receive and process the data from the decoder in time-reversed order; and (iii) such that upon completion of said processing of said data, if no errors are present in the data, the state of the plurality of linear feedback shift registers is equal to a fixed initial state, and
   wherein a set of multipliers corresponding to a set of coefficients is interposed in the feedback oaths such that when data are shifted through the feedback shift registers, the device performs division by x for an input bit equal to 0, and, for an input bit equal to 1, performs division by x and then adds $x^{k+m-1}$, where x is a variable of a generating polynomial $g(x)=g_k x^k + g_{k-1} x^{k-1} + \ldots + g_1 x + g_0$, k is the highest order of the generating polynomial, and m is the total number of input bits to be decoded.

2. The device of claim 1, wherein the fixed initial state is all ones.

3. The device of claim 1, wherein the decoder comprises a Viterbi decoder.

4. The device of claim 1, wherein the device is configured to receive data transmitted according to a code division multiple access methodology.

5. The device of claim 1, wherein the state of the linear feedback shift registers is initialized to the CRC by first initializing the linear feedback shift registers to all zeros and then loading the CRC into the cyclic redundancy check circuit in the same manner as the data.

6. An apparatus for decoding and error-checking data that have been encoded with a convolutional code, said method comprising:
   (a) means for receiving: (i) data having been used to generate a cyclic redundancy code (CRC) and then encoded with a convolutional code, and (ii) the CRC for the data;
   (b) means for decoding the data to remove the convolutional code and outputting the data in time-reversed order; and
   (c) means for utilizing a cyclic redundancy check circuit which includes a plurality of serially connected linear feedback shift registers, collectively having a state: (i) to initialize the state of the linear feedback shift registers to the CRC; (ii) upon completion of said initialization, to receive and process the data from the decoder in time-reversed order; and (iii) such that upon completion of said processing of said data, if no errors are present in the data, the state of the plurality of linear feedback shift registers is equal to a fixed initial state, wherein a set of multipliers corresponding to a set of coefficients is interposed in the feedback paths such that when data are shifted through the feedback shift registers, division by x is performed for an input bit equal to 0, and, for an input bit equal to 1, division by x is performed and then $x^{k+m-1}$ is added, where x is a variable of a generating polynomial $g(x)=g_k x^k+g_{k-1} x^{k-1}+ \ldots +g_1 x+g_0$, k is the highest order of the polynomial, and m is the total number of input bits to be decoded.

7. The apparatus of claim 6, wherein the fixed initial state is all ones.

8. The apparatus of claim 6, wherein said means for decoding comprises a Viterbi decoder.

9. The apparatus of claim 6, wherein said apparatus is configured to receive data transmitted according to a code division multiple access methodology.

10. The apparatus of claim 6, wherein the state of the linear feedback shift registers is initialized to the CRC by first initializing the linear feedback shift registers to all zeros and then loading the CRC into the cyclic redundancy check circuit in the same manner as the data.

* * * * *